(12) United States Patent
Villaret et al.

(10) Patent No.: US 6,658,524 B1
(45) Date of Patent: Dec. 2, 2003

(54) MEMORY WITH CALL OUT FUNCTION

(75) Inventors: Emanuel Yves Villaret, Hadera (IL); Shmuel Prokopets, Bnei Brak (IL)

(73) Assignee: MEMCALL LLC Corporation Service Co., Wilmington, DE (US)

( * ) Notice: Subject to any disclaimer, the term of this patent is extended or adjusted under 35 U.S.C. 154(b) by 0 days.

(21) Appl. No.: 09/914,918

(22) PCT Filed: Feb. 28, 2000

(86) PCT No.: PCT/IL00/00121

§ 371 (c)(1),
(2), (4) Date: Dec. 21, 2001

(87) PCT Pub. No.: WO01/65564

PCT Pub. Date: Sep. 7, 2001

(51) Int. Cl.[7] ............................................... G06F 12/06
(52) U.S. Cl. ....................................................... 711/108
(58) Field of Search ......................................... 711/108

(56) References Cited

U.S. PATENT DOCUMENTS

| 4,805,093 A | * | 2/1989 | Ward ............................ 364/200 |
| 5,497,488 A | | 3/1996 | Mitsuru et al. |
| 5,502,832 A | * | 3/1996 | Ali-Yahia et al. ............ 395/435 |
| 5,568,416 A | * | 10/1996 | Kawana et al. ................ 365/49 |

FOREIGN PATENT DOCUMENTS

| WO | WO 0004553 | 1/2000 |

* cited by examiner

Primary Examiner—Kevin L. Ellis
(74) Attorney, Agent, or Firm—Lowe Hauptman Gilman & Berner LLP

(57) ABSTRACT

A memory system includes an array of memory cells with a Bit Mask circuit provided in each memory cell. The memory system also includes a bus circuit with a set of Address Bus lines, a set of Data Bus lines, a set of Origin Bus lines and a set of Control lines, each memory cell being connected to each of the sets of lines. In a first operating mode, the system stores data applied on the Address Bus. In a second operating mode, a memory cell having a position defined by the Address Bus outputs on the Data Bus the data stored in that cell. In a third operating mode, the searched data is applied on the Address Bus and each memory cell with matching data outputs on the Data Bus a value representing the Address of the memory cell. However, the cell address is output on the Data Bus only where the position of that particular memory cell is the closest, in a predefined direction, to the data set on the Origin Bus among all the cells with matching data.

7 Claims, 7 Drawing Sheets

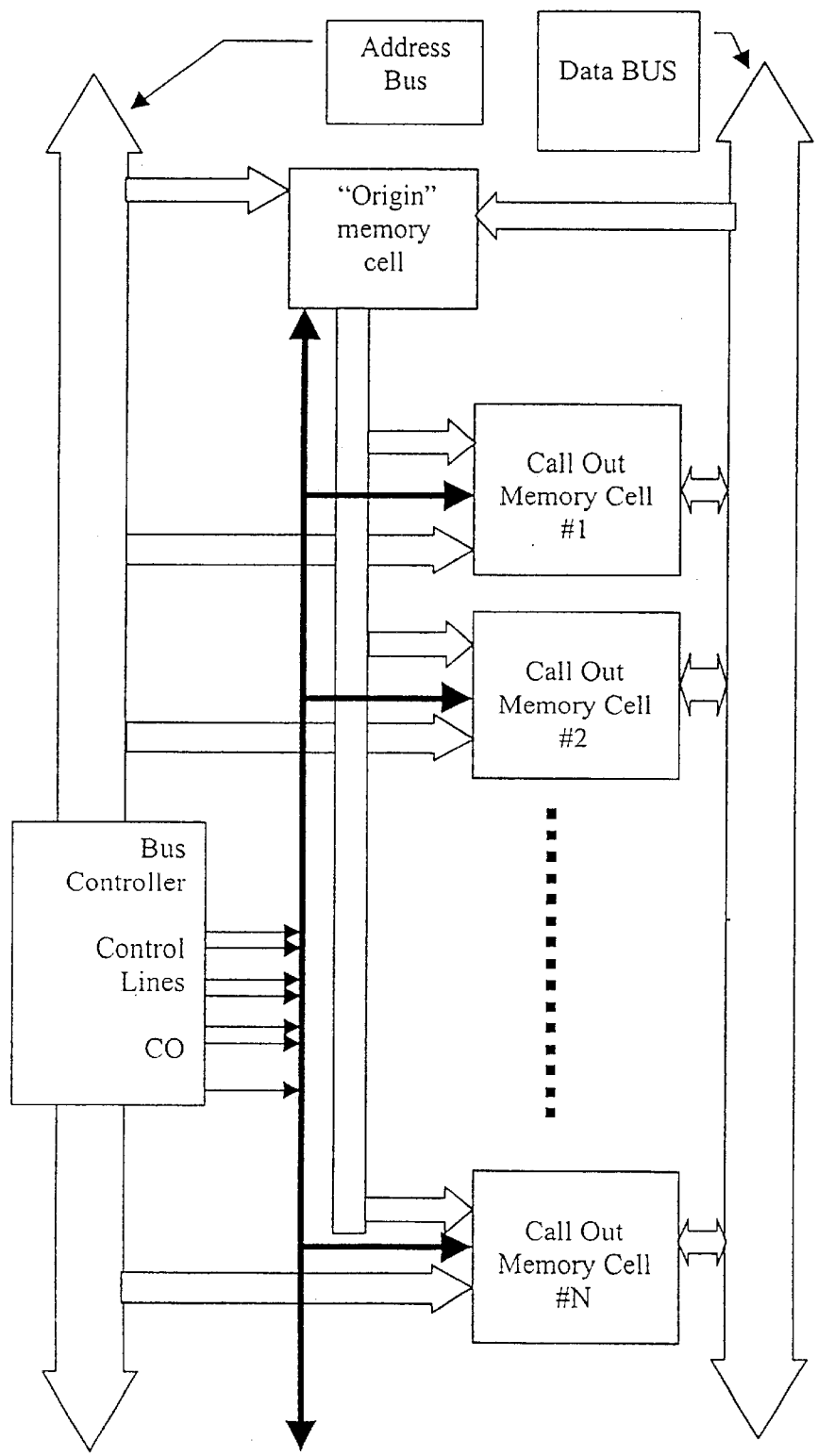
Fig: 1

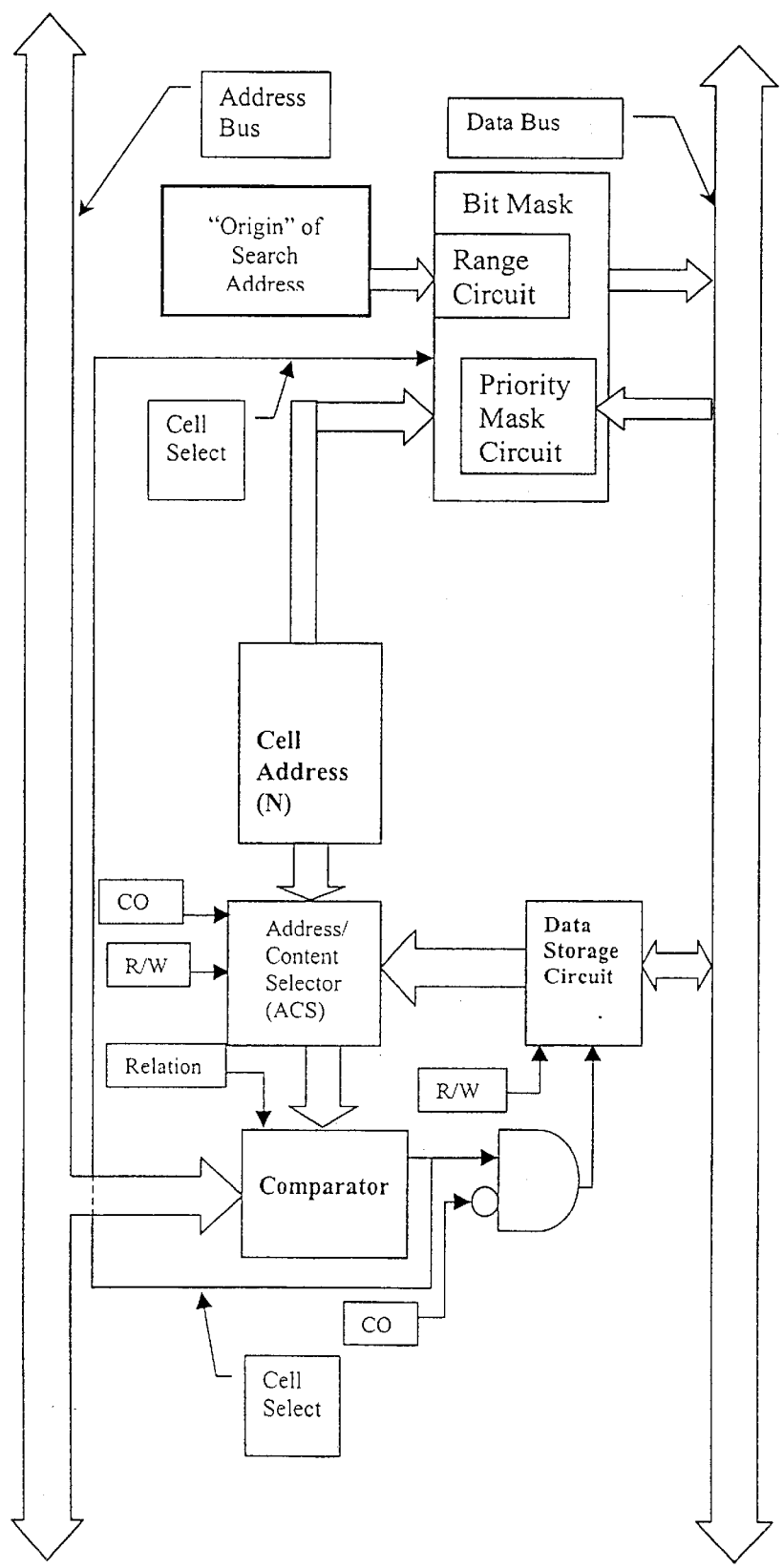
Fig: 2

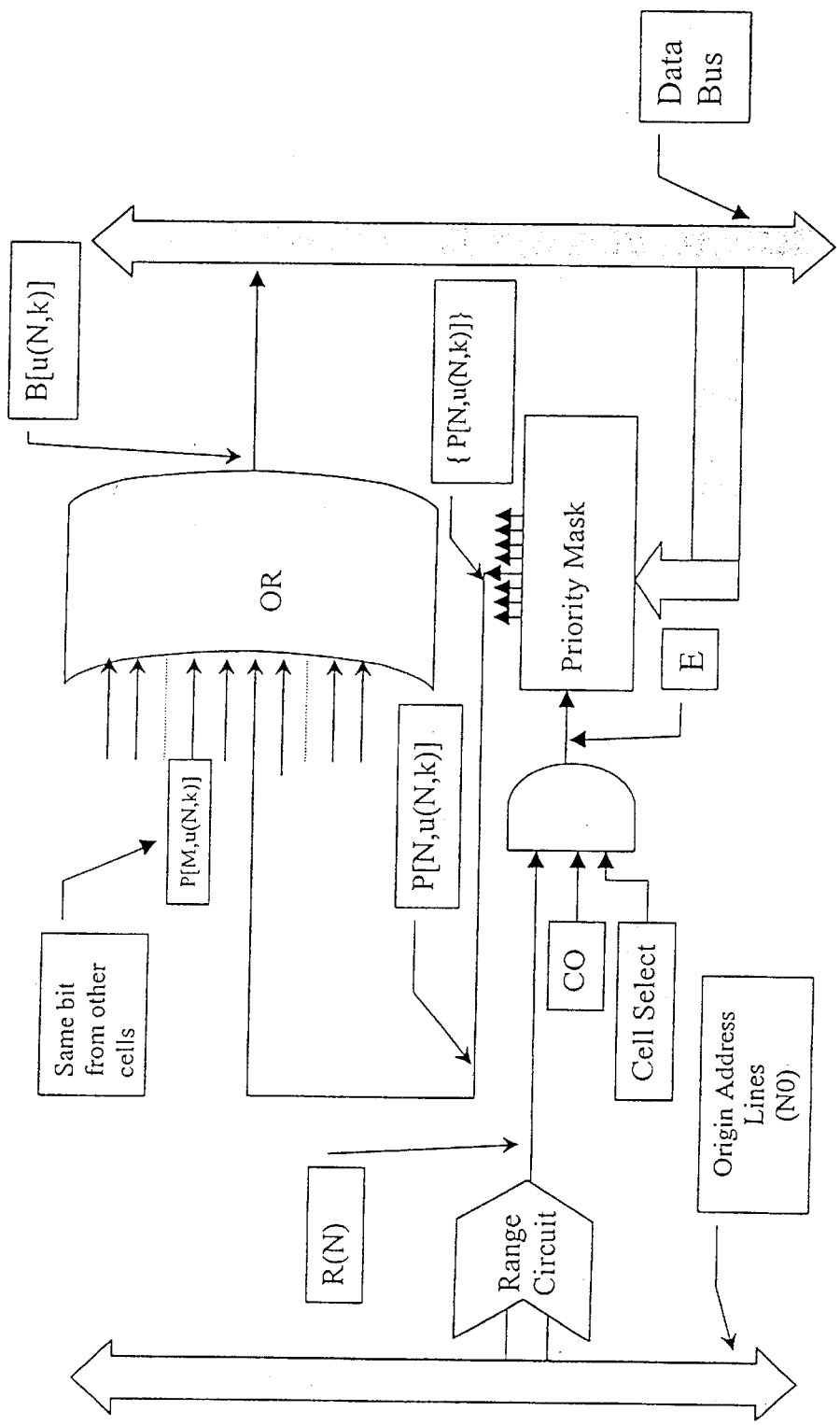
Fig: 3

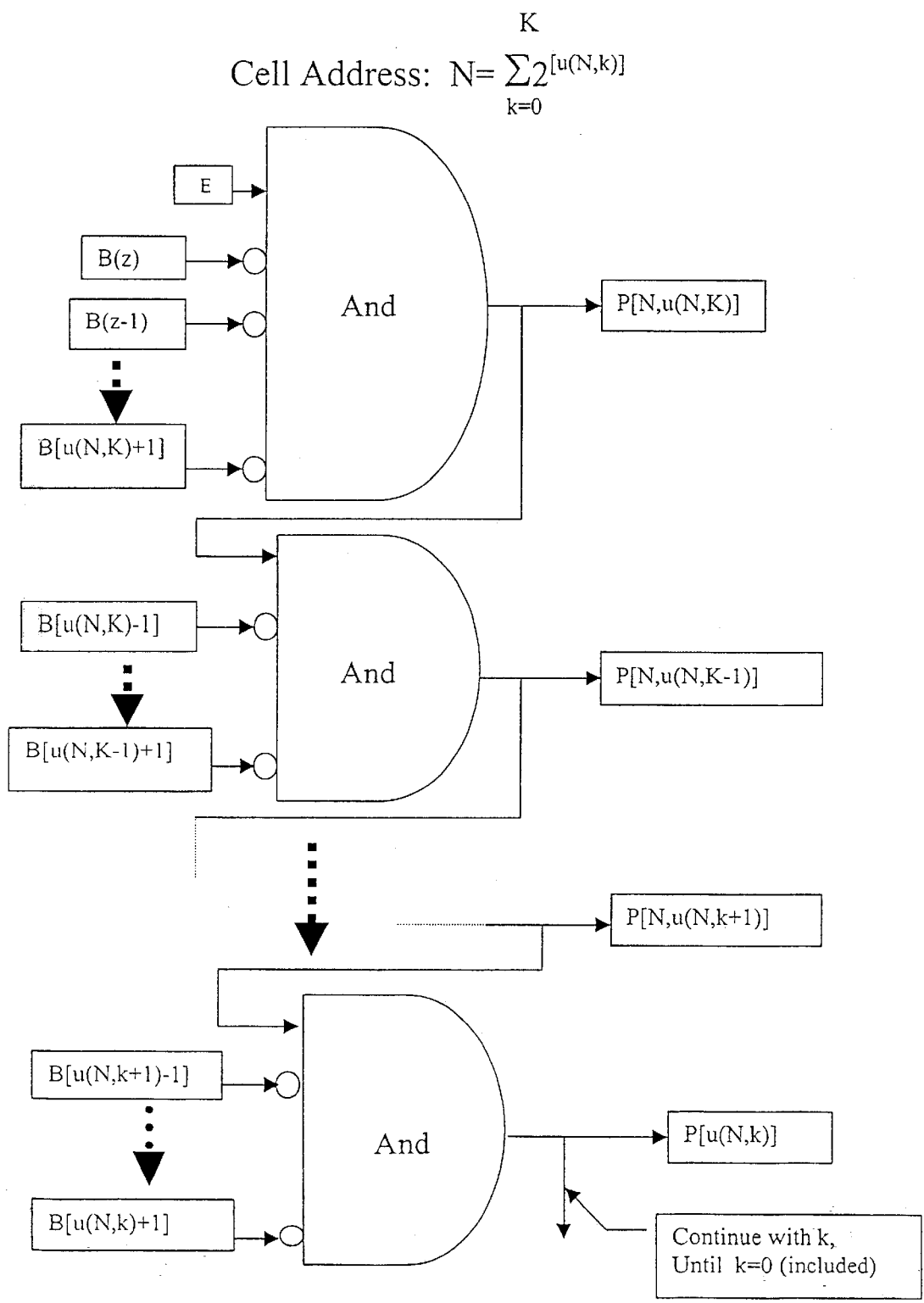
Fig: 4

Cell Address: N= 10001010;
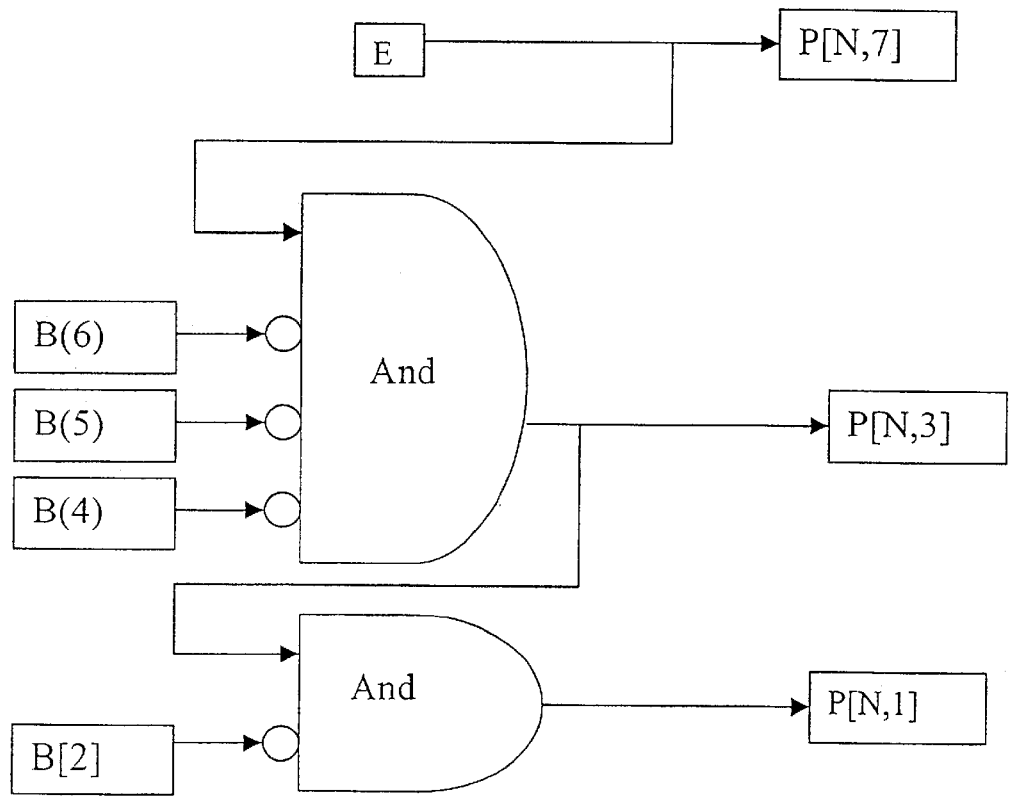
Fig: 5

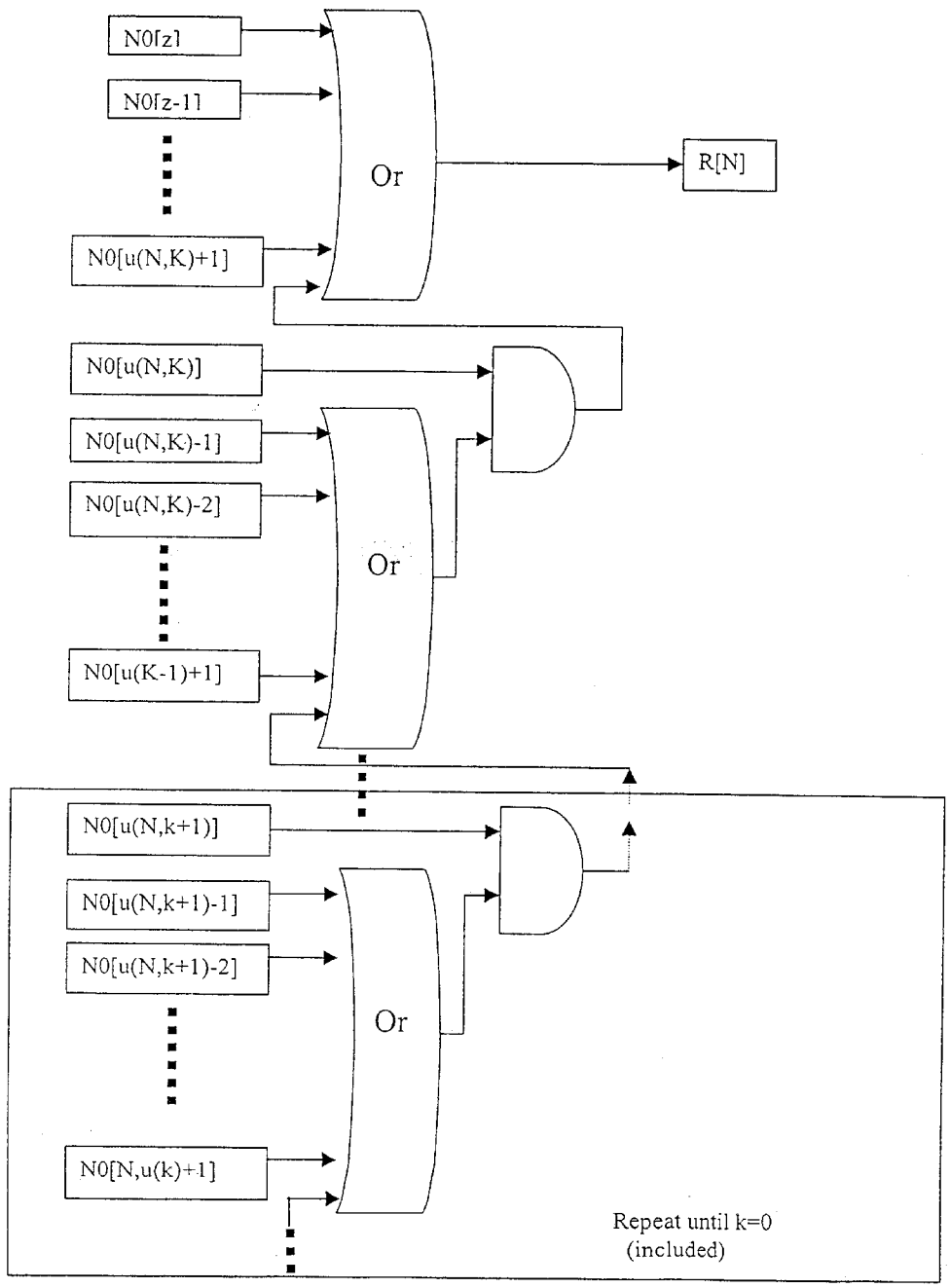
Fig: 6

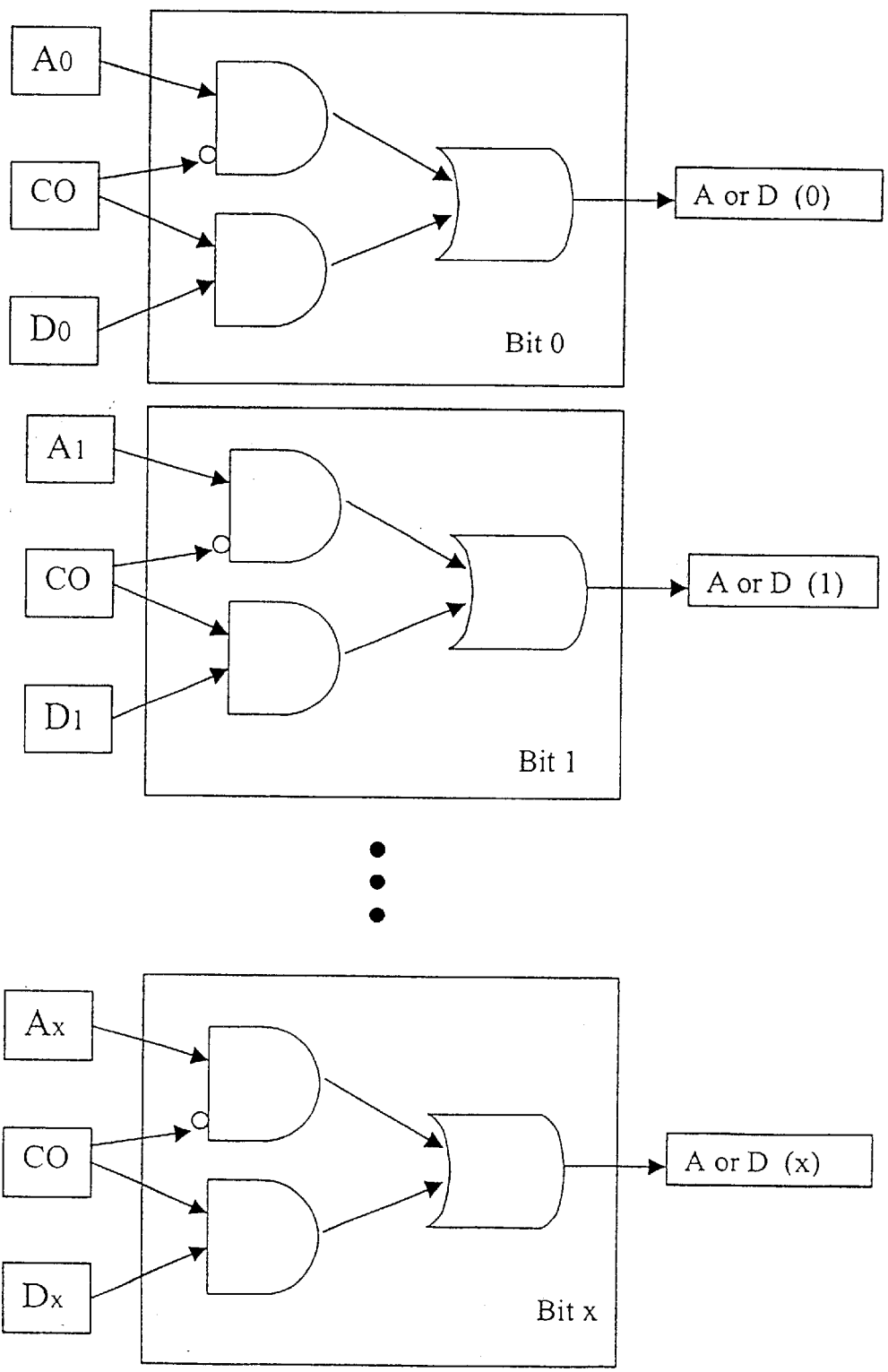
Fig: 7

MEMORY WITH CALL OUT FUNCTION

BACKGROUND OF THE INVENTION

In a computer system, a processing unit (CPU) is commonly connected to a memory device. One of the routine operations to be performed by the CPU operated program is that of scanning a predetermined part of the memory locations, in order to find the memory cell in which a specific data is stored. Because the position of the searched data is not known in advance the scanning operation is a lengthy process allowing for the CPU to scan a whole section of memory, addressing each cell, reading the data in that cell and comparing it to the searched data.

The prior art may be demonstrated by the example of a computer system with a memory that stores an extensive list of names, first names, age and other personal data all arranged in an alphabetic order by name. When a list of all persons having the age of 20 is required, the computer system will scan the whole memory, read the age of each of the persons on the list, and in case that the age is 20, register the name of the respective person in a new list. For a list of 100000 persons, the program will be required to perform 100000 operations.

It is therefore necessary to design a new, time saving process for locating data in a memory system without scanning each of the data in the memory. Such a process would have an almost universal application improving efficiency in many fields including personal computers, internet servers, computerized production methods, data processing and any other art that employs computer systems.

In the prior art it is known to use a Content Addressable Memory (CAM). However existing CAM devices are different from the conventional memory devices and they require the use of a specially adapted interface circuitry (U.S. Pat. No. 4,805,093). It is a further drawback of the prior art that separate devices are required in order to enable a system to perform both conventional read/write operations and CAM data searches. It is therefore desirable to have a CAM device that may be connected to the processing unit via an Data Bus and an address bus and therefore may be used in most conventional computer systems. It is also desirable to have a device that may be operated in both normal and call out modes alternatively.

In some prior art CAM systems the response time usually increases with the size of the memory being searched, the reason being that cells are linked by a signal that passes each cell in turn (U.S. Pat. No. 4,805,093) or that the search function is performed by a scanning mechanism (U.S. Pat. No. 5,502,832). In other prior art systems, a match signal is propagated through the cells, passing each of the cells in turn, so that if a matching cell is far from origin, the response time will be longer, due to some propagation delay occurring at every cell.

In some CAMs of the prior art the address of the data to be stored is not specified. The device stores the data at an address determined by the device logic and retrieval of the data may only be achieved by Content Addressing. It is therefore desirable to have a memory in which data storage is performed by specifying the address of a cell on an Address Bus and subsequently presenting the data to be stored on a Data Bus whereby data may be stored and retrieved in the same way as in a conventional memory and the call out search mode is provided as an additional function.

In another prior art device, described in U.S. Pat. No. 5,568,416, a content addressable memory contains a plurality of memory cells, in each cell a match output line is provided and all match output lines from all cells are connected to a priority encoder that generates the address of the highest priority matching cell. In this type of prior art it is necessary that the priority encoder comprise a large number of inputs, one for each of the cells. Consequently a large number of gates and an extensive surface are required to allow for the routing of the matching lines from each of the cells respectively to the priority encoder, whereby the practical capacity of these CAMs is most limited.

It is therefore desirable to have a Call Out memory that is not operated through a global circuitry, in which the "Call Out" function is added separately in each of the cells. In such a memory with a parallel organization where each cell is independent and connected to an Adress Bus, a Data Bus and an Origin Bus, response time is not dependent on the size of the memory, nor on the position of the searched data and the number of logic gates necessary to implement the "Call Out" function. A device of this type has the advantage that a large memory device may be implemented at low cost and due to the parallel structure several "Call Out" devices may be used to implement a large memory.

SUMMARY OF THE INVENTION

The present invention concerns a method for increasing the velocity of operation of an electronic searching system such as a computer searching system and an increased velocity memory and circuit to be used in the implementation of an advantageous memory device for computers, electronic systems, internet servers etc.

The inventive device and method greatly improve the searching sequence of the system, providing means to search the position of a given data, previously stored in the memory, while eliminating the need to scan all the data in the memory. Due to an innovative logic device comprised in the circuit of the invention, in spite of the fact that many cells of the memory device may respond to the request, only one address is seen. The required time to find one memory cell containing the searched data is thus reduced to a single memory cycle.

A set of lines or an additional memory cell is used to define an "Origin" for the search, so that the address of the cell with matching data that is seen is the one closest to the "Origin" address in a predefined direction and the search can be repeated in that direction until all matching data are located.

The memory comprises an array of innovative memory cells, each cell comprising a masking circuit that selectively inhibits the output of the search data depending on the position of the cell relative to the Origin and to other matching cells.

The memory has a parallel organization wherein each cell is independently connected to a Bus system comprising an Adress Bus, a Data Bus and an Origin. Data storage is performed by specifying the address of a cell on the address bus and subsequently presenting the data to be stored on the Data Bus whereby data may be stored and retrieved in the same way as in a conventional memory and the call out search mode is provided as an additional function.

For a comparison with the above example of the prior art, we may take the example of a memory that stores data for 100,000 persons of whom only 5000 have the age of 20. The memory of the invention will be programmed to first set the Origin address to the address of the uppermost item of the list in a predefined direction. Next the system will be operated in the Call Out mode and the data 20 will be set on the Address Bus. The Call Out memory will then set on the Data Bus the address of the person with the age of 20 that is highest on the list in the predefined direction. A processor will then read in normal mode the data at that address and write it down in a new list. Next the processor will set the Origin to the address of the first found name and repeat the search in the Call Out mode. After repeating the procedure 5000 times, a complete list of persons with the searched data (age: 20) will be obtained. The prior art process would require 100,000 operations to arrive at the same result, which makes the inventive search method 20 times faster.

It is an important advantage of the invention that the device is capable of operating in two alternative modes: In the first mode (Normal) the function is similar to that of a common memory device. In the second mode (Call Out) the device implements the Call Out function.

It is another advantage of the present invention that the device architecture is compatible with commonly used computer devices, and it may be used together or in replacement of standard memory devices of different types.

It is yet another advantage of the invention that the number of logic gates necessary to implement the "Call Out" function grows only linearly with the size of the memory whereby a large memory device may be implemented at low cost.

DESCRIPTION OF THE DRAWINGS

FIG. 1 shows the general architecture of a Call-Out memory device according to the invention.

FIG. 2 shows the general Block Diagram for a Call Out Memory Cell.

FIG. 3 shows a Bit Mask Circuit for the set bits of the Cell Address.

FIG. 4 shows the "Priority Mask" circuit.

FIG. 5 shows an example of a "Priority Mask" circuit.

FIG. 6 shows the "Range" circuit, used to select cells with address inferior to the Origin.

FIG. 7 shows an example of a logic device that may be used to select the input to the comparator.

DETAILED DESCRIPTION OF THE INVENTION

It is the aim of the present invention to overcome the drawbacks of the existing memory systems by proposing a combined call out memory and conventional memory method implemented in a novel memory device that may be applied in a conventional electronic system such as a computer system.

The memory device of the invention comprises an array of innovative memory cells, each memory cell comprising a storage area of standard type and an innovative circuitry that implements the so called "Call Out" function. The memory device may be operated in two alternative "Modes": "Normal" mode and "Call Out" mode. In accordance with a preferred embodiment the operating mode of the device is determined by a dedicated connection line. It ill be understood however that the Call Out mode may be entered by any other interface as known.

In the memory device a plurality of data lines are provided, connected in parallel to each of the memory cells respectively, these lines being the means for setting an "Origin" of search address. In a first embodiment these lines are internally set to a given state representing the "Origin" address by means of one particular memory cell. In a second embodiment an external device is used to set the state of these data lines.

Each cell is capable of storing and retrieving data, in a way known from commonly used memory devices. The data is stored or retrieved by means of data lines (Data Bus) that transmit the data to or from a processor such as a CPU. Another set of lines (Address Bus) is used to address a particular memory cell for the read or write operation. Commonly, a number of control lines are also used to perform the action of read and write. The ensemble of Data Bus, Address Bus and Control Lines is commonly called the System Bus. The system bus may further comprise an Output line.

In the inventive method and system, there is provided means for putting the memory in the Call Out mode such as a control line. In the "Call Out" mode, the roles of address and data are inverted. A processor sets on the "Address Bus" the Data to be fetched, or part of it if "Address Bus" is of a smaller size than "Data Bus". In each cell, a common circuitry that compares the address data applied on the address bus to the address data stored in the memory cell is now used to compare the data stored in the cell to the Address Bus data. This is done by adding an electronic module that replaces the cell Address with the cell Data for input to the comparator. If the two data match, then the address of the cell is presented on the Data Bus. In this context match may refer to any predefined relationship such as equal, bigger than, smaller than or any logical combination as known.

Several cells may contain matching data. However the address of one cell only should be set on the Data Bus.

An innovative circuitry is therefore used to mask the data on some lines, so that the data appearing on the Data Bus represents the address of only one of the memory cells containing the searched data. It is a characteristic feature of the invention that the masking circuitry is added to each memory cell respectively, resulting in a parallel memory structure.

The mask circuit receives as input the Data Bus. In accordance with one preferred embodiment an internal Output Bus is used as an intermediate buffer. If a memory cell contains data that match the one presented on the Address Bus, then the address of that cell is logically combined in the Priority Mask circuit, resulting in an output on the Data Bus. Several cells, each containing matching data, may apply their addresses on the Priority Mask. However the resulting Data output on the Data Bus will represent the Address of the cell with the address value that is closest in a preset direction to an "Origin" address set on the "Origin" lines. While the invention is described herein for an embodiment in which the cell address is output on a Data Bus, it will be appreciated that other means such as an additional set of lines may be employed for the same purpose. In particular an Output Bus may be used as an intermediate buffer. It will be understood that such an Output Bus is a practical and useful way of achieving modular interfacing with a computer system.

It is an advantage of the inventive device and process that the time required for finding one particular word stored in the memory can be made equal to the time required for writing/retrieving data in the normal mode, whereas in standard computer systems, finding the Memory Address at which a given data is stored is a prolonged operation, since the CPU must scan whole sections of memory until the given data is found.

It is another advantage of the invention that the memory device may be used in existing standard computer systems and replace advantageously the commonly used memory devices.

In accordance with a further advantage of the inventive process the time required for finding a particular data is not dependent on data position, nor on the number of cells comprised in the memory device. It is yet another advantage of the invention that because of the parallel architecture of the inventive memory device, several devices can be modularly added to enlarge the capacity of the memory. Due to the expandibility and the said parallel architecture of the inventive device any number of devices can be installed in a computer system depending on the size requirements of the system.

Also due to the parallel architecture of the inventive device, the number of logic gates necessary to implement the "Call Out" memory is directly proportional to the size of memory. In some prior art systems such as CAM memories the number of gates is growing at a considerably higher rate with an increase in memory size. As a result the inventive device is time and space saving as well as enabling a considerable saving of costs.

In accordance with a further advantage of the invention, a computer system may be designed with all its working memory being Call out Memory. Such a system, combined with appropriate software can then drastically improve the overall performances of the computer.

The invention will be described hereinbelow in respect of a preferred embodiment. It will be understood however that many modifications and applications of the invention may be envisaged that still remain within the scope of the specification and the claims.

In particular the logical function of the circuits comprised in the inventive memory may be implemented in different but equivalent ways known in the art.

DETAILED DESCRIPTION OF A PREFERRED EMBODIMENT

The invention is described hereinbelow in respect of a preferred embodiment of the inventive memory wherein search direction is defined as a direction downwards from origin and the memory cells to be searched are those with an address value smaller than origin. It will be understood however that the invention may be implemented by defining other relationships between the origin and the memory cells such as larger; equal or smaller: equal or larger etc.

The general architecture of a preferred embodiment of the Call Out Memory Device of the invention is shown in FIG. 1. As seen in FIG. 1, the Call Out Memory device comprises an array of memory cells. Each memory cell is connected to the System Bus. i.e. to the Address Bus, Data Bus and Control Lines. Each memory cell is also connected to a number of Origin lines, the said Origin lines defining a so-called "Origin" address. These lines may be internal to the device, or connected to an external system and their logic states define an "Origin" for the search function. In accordance with the preferred embodiment, when the Call Out Memory is operated in the search mode only memory cells having an address value smaller than the "Origin" address will be searched. Another line, designated CO in FIG. 1, issues from the Bus Controller and is used to set the memory in the "Call Out" mode.

In the preferred embodiment, the System Bus is comprised of the following components:

A "Data Bus", comprising a plurality Z of data lines;

An "Address Bus", comprising a plurality A of address lines;

A Bus Controller comprising a plurality of "Control Lines" is provided in the inventive memory for Bus Synchronization. Similar control lines are known to be applied in common computer systems for communication with external memories and devices.

In the framework of the present invention only the following control lines that are comprised in the preferred embodiment will be mentioned:

A "Read/Write", line used for selecting a Read or Write operation.

A "CO" line, used for selecting the "Call Out" mode.

Other control lines that perform various functions as known for Bus Systems.

Each memory cell is able to store a plurality Z of bits in the storage section.

Each memory cell receives as input the "CO" control line; this control line determines whether the cell will be operated in normal memory mode ("Normal Mode"). or in the new mode ("Call Out Mode").

When the (CO) line is not active, the device functions as a standard memory array. When the (CO) line is active, the device functions in the innovative "Call Out" mode. In accordance with the preferred embodiment, the Call Out Memory is meant to be used in combination with a processing unit (CPU). It is however envisaged that the Call Out Memory of the invention be used in an electronic system that does not include a CPU. In order to communicate with the Call Out Memory in the Call Out mode, the CPU must first activate the CO signal. This can be done in many ways, commonly used in electronic systems to select different devices connected to the system Bus (often called "Chip Select") of which two examples are described below:

In a first preferred embodiment, the CO line is activated by a logic combination of the level of certain address lines. This method is enabled where the size of memory used is smaller than the addressable space defined by the number of address lines such that some address lines may be dedicated to addressing diverse devices. In the inventive memory these surplus lines may be used to address the memory in the Call-Out mode. In other words, a small number (CS) of the address lines, in FIG. 1, will be used to "Chip Select" the Call Out function of the Memory. Because these few lines cannot be used to present the data to the Call Out Memory the maximum width of the data word that can be searched in the "Call Out" mode will be reduced to (A-CS). It will be understood that where the size of the Address Bus exceeds that of the Data Bus, no restriction will be added to the size of the searched data as determined by the size of the Data Bus. It will be understood that this method is advantageous in systems where the number of address lines is bigger than the size of the data to be searched.

In a second preferred embodiment, a logic circuit is implemented in the Bus Controller so that reading or writing to a dedicated address sets the (CO) line. In this embodiment the Bus Controller circuit detects Writing/Reading to the said address, sets the (CO) line, and maintains the (CO) line active during the next Bus Cycle. It is a common technique in computer systems to use a Bus Controller, so that the (CO) line control function can be easily added inside the Bus Controller. In this embodiment, the width of the Data to be searched is not reduced due to the need to activate the Call Out function, but a Call Out cycle will require two Bus Cycles instead of the single cycle of the first preferred embodiment.

In accordance with the invention, any kind of memory cell of the existing type may be used to store the data to be searched by the inventive memory array and the novel Call Out function is enabled by the addition to the memory cells of a circuitry described hereinbelow.

FIG. 2 is a general block diagram of the circuitry for the call out memory cell of the invention in accordance with a preferred embodiment, wherein "Data Storage circuit" is the circuitry used to store the data. Such circuitry is of common use in memory devices.

The "Address/Content Selector" block of FIG. 2 represents a specific element added to the memory circuit in accordance with the present invention. As shown in FIG. 2, this logical module receives as input the CO line. The Address/Content Selector module provides a switching function for selectively connecting one of the two sets of inputs (Memory Cell Address and Stored Data) to the comparator input. When the CO line is in the Normal Memory Mode State, the Cell Address is applied to the comparator. When the CO line is in the "Call Out" memory mode it is the stored data that is applied to the comparator.

The "Comparator" block of FIG. 2 represents the circuitry that is commonly used in a memory cell to compare the Address Data applied on the Address Bus to the specific Cell Address. In the preferred embodiment, the Comparator simply checks the equality of both data. However, in other embodiments, the Comparator can check other relationships, selected from a predefined set. Examples of such relationship are Greater Than, Smaller Than, Same Sign etc. A small number of dedicated control lines may be used to select the relevant relationship from a set of predefined relationships. If both Address Data and Cell Address are found to be matching (i.e. verify the defined relationship), the Cell Select line is activated and the Data stored in the cell is connected to the Output Bus for read or write operation. In the Call Out mode, the same comparator is used, but in the "Call Out" mode it is the Data of the Address Bus that is compared with the Data stored in the memory cell.

It will be understood that different comparators may be used to perform the Call Out function and the normal memory function.

The Comparator circuit activates a "Cell Select" line according to its inputs, those inputs being the Address Bus Lines on one side, and the output of the Address/Content selector on the other side. The "Cell Select" is activated in two cases:

First case: CO line is in the "Normal" mode, and the address of the cell matches the address applied on the Address Bus.

Second Case: CO line is in the "Call Out" mode, and the Data stored inside the memory cell matches the Data Applied on Address Bus.

Referring again to FIG. 2, the "Bit Mask" circuit is shown that is added to the cell circuitry to enable the implementation of the Call Out function. As shown in FIG. 2, the "Bit Mask Circuit" comprises a "Priority Mask" circuit, a "Range" circuit and a logical circuit to interface to the Data Bus.

In accordance with the inventive process, when the CO line is active and the "Cell Select" line is also active, due to the cell Data being matching to the Data applied on the Address Bus, the set bits of the cell address are connected to the "Bit Mask" circuit and masked. As seen in FIG. 2, the "Bit Mask" circuit comprises a "Range" circuit and a "Priority Mask" circuit. In a first step the Range Circuit compares the cell address with an "Origin" address and only where the cell address is smaller than the "Origin" address the signal R(N) is sent to the Priority Mask. The "Priority Mask" circuit then selects the bits to be output to the Data Bus by a process wherein all set bits of all memory cells storing the searched data and fulfilling the requirement of the cell address being smaller than the "Origin" address are combined in an "OR" function to set the correspondent bit of the "Data Bus". Only the bits selected by the "Priority Mask" circuit, are passed through to the "Data Bus". The overall function of the "Bit Mask" circuit is to mask the bit outputs that would change a higher address output detected on the Data Bus. The resulting data seen on the Data Bus will then be equal to the Address of the cell with the highest Address but smaller than Origin and containing the data that match the data applied on Address Bus.

It will be understood that the above procedure relates to a downward search. Where the system is defined to make an upward search, the address selected will be the smallest address that is larger than the Origin.

FIG. 3 shows an implementation of the "Bit Mask" function. Where N designates the number representing the cell address, the binary representation of N will be the following:

$$N = \overset{K}{\underset{k=0}{S}} 2^{[u(N,k)]}$$

wherein u(N,k) are the set bits of the address value and K is the number of set bits of the N number minus 1.

For example a cell address 37, has the binary representation 100101. Then we have:

K=3; bits 0,2 and 5 are set u(37,0)=0;→First set bit at position 0 u(37,1)=2;→Second set bit at position 2 u(37,2)=5→Third set bit at position 5

Referring now to FIG. 3, a Bit Mask Circuit for set bits of a cell with an address N is shown, wherein the "Origin of Search Address" is set by a number of lines connected in parallel at each memory cell to the Range Circuit of the cell, designated "Origin Address Lines". The logic levels of the Origin Address lines represent the "Origin" address. These lines can be set, for example, by an external device. In accordance with a preferred embodiment, the "Origin of Search " lines may be connected to data written in one dedicated memory cell.

The "Range Circuit" of FIG. 3 compares the "Origin" with the cell address N. If the cell address is smaller than the Origin address, then the signal R(N) is output to the Priority Mask. An example of a comparison circuit is shown in FIG. 6. It will be understood by those versed in the art that any comparison circuit of known technique may be used to perform the comparing function of the Range circuit.

Referring again to FIG. 3, a "Priority Mask" circuit is comprised in the Bit Mask circuit, the said Priority Mask circuit having K output lines P[N,u(k)]. The Priority Mask Circuit will be described in detail hereinbelow with reference to FIG. 4. The function of the Priority Mask Circuit is to decide which bit of the cell address is to be output to the Data Bus {B$_i$}. The decision is made by a logic combination of the present state of the Data Bus itself and of the Cell Address. This circuit function can be described as a feedback system between the Data Bus and the memory cell circuit. The state of the Data Bus is sensed by the Priority Mask that sets a feedback output on lines P[N,u(N,k)] which in turn affects the state of the Data Bus.

This feedback method allows the specific memory cell circuit to sense whether any other cell at higher address is outputting address data on the Data Bus, and if so mask its own bits in order to let the cell at highest address be the only one to output its address on the Data Bus.

It will be understood that the above relates to a downwards search and where the system is defined to make an upward search it is the lowest address that will be put on the Data Bus. The operation of the Priority Mask Circuit may be described as follows: The searched data is presented on the Address Bus and the Origin address is set. For each memory cell an AND logical combination of "Cell Select", R(N) and CO lines is performed to output an Enabling signal "E" to the "Priority Mask". Thus the "Priority Mask" will reset all P[N,u(N,k)] lines to zero logical state if one of the following conditions is not satisfied:

_The Cell Address is higher or equal to the Origin address.

_The Data Stored in Cell is equal to data presented on Address Bus.

_The device is not in the "Call Out" mode.

All P[M,u(N,k)] lines, from all memory cells (M) having bit u(N,k) set, are input to an OR logical circuit, and the output of that circuit is set on the Data Bus as bit u(N,k). M is a generic that represents the addresses of all the cells of the device having bit u(N,k) set.

At the beginning of a Call Out cycle, the Data Bus lines are in an inactive (Logical 0) initial state. For example, if we use negative logic, all lines are "Pulled Up" by a resistor to the plus of the system power supply. In a first step the priority mask senses all these lines as inactive, and outputs the P[N,u(N,k)]. In that first step, many other cells may also set the Data Bus line by means of the OR circuit. This new state of the Data Bus will then be sensed by each of the cell Priority Mask Circuits respectively and some of the P[N,u(N,k)] lines will be deactivated, according to the rules of the priority mask. Finally, bits P[N,u(,k)] that are not set in the address of the highest cell storing the searched data will be reset, and the Data Bus will be set to that highest cell address. This process is asynchronous; the time needed for the lines to stabilize to their steady value is of the same order as the rising time of the electronic components of the circuit. As a result, the time required to search one data is of the same order as a normal read or write cycle.

Referring now to FIG. 4, the "Priority Mask" circuit is shown in detail. The "Priority Mask" circuit outputs bit P[N,u(N,k)] if the following conditions are satisfied:

For the highest bitset: u(N,K)

a)_if "Cell Select" and "R(N)" signal are active.

b)_AND if all bits of the Data Bus higher than u(N,K) are not set. If there is no higher bit, i.e. if the highest bit is bit Z, then this bit is directly set by the "E" signal.

For other bits: u(N,k), k<K a)_the higher bit u(N,k+1) is set b)_AND all bits of the internal bus B[u(N,k)] between present bit u(N,k) and higher bit u(N,k+1) are not set.

This ensures that if another cell with a higher address has output its address on the Data bus, at bits that are not set in the present cell, then bits k and lower of the present cell address are not output. Finally only bits that are set in the highest matching memory will be output.

It will be understood that the above is described for a downward search and where the system is defined to conduct an upward search it is the lowest matching memory that will be output on the Data Bus.

A specific example of the Priority Mask circuit operation for a cell address N=10001010, with three set bits u(0)=1; u(1)=3; u(2)=7 that generates three outputs P[N,1]; P[N,3] and P[N,7] is shown in FIG. 5. In this example E is used because no higher bit exists.

DESCRIPTION OF THE DUAL MEMORY FUNCTION

When used in the "Normal" mode (CO line not active), the function of the Call

Out memory is exactly similar to that of a commonly used memory device. Address data is applied on the Address Bus, control lines are set to define Read or Write operation, then data is moved from or to memory cells through the Data Bus. The addressed cell is selected by means of the Comparator. The Address/Content Selector senses the "CO" line low, and thus outputs the Cell Address to the comparator. If that address is found to match the Address Data set on the Address Bus, then the Cell Select line is set. If the Read/Write line is in the "Write" state, then the memory Data Storage Circuit outputs the data to the Data Bus. If the Read/Write line is in the "Read" state, then the memory Data Storage Circuit stores the data from the Data Bus. While operating in the normal mode, the Bit Mask circuit is set inactive by the inactive state of the CO line.

When operating in the "Call Out" mode (CO line active), the Data value to be searched is placed on the Address Bus and the Read/Write line is set to the "Read" state. The Address/Content Selector then applies the Stored Data at the Comparator Input. If there is a match, then the Cell Select line is set. The Bit Mask Circuit is set Active by the CO line, but the Data Storage Circuit is deactivated so that it will not set any Bus line. In this status only the Bit Mask applies data to the Data Bus.

The Cell Select signal is input to the Bit Mask circuit together with the Origin Address data that have been previously set on the Origin Address Lines. The Bit Mask circuit masks each bit so that the resulting data applied on the Data Bus is that of the closest but smaller address to origin. Individual bits of the address (from one or more cells) may be output to the Data Bus even where the cell address is not the closest one to origin, however the resulting data on Data Bus is that of the closest address.

The cycle can be repeated with the highest address now used as Address of Origin until all the addresses of the cells containing the searched data are presented on the bus in a sequence from highest to lowest. The duration of the search equals the duration of N read and write cycles where N is the number of cells containing the requested data.

It will be understood that the above is described for a downward search and where the system is defined to conduct an upward search the resulting data on the data bus after a single cycle will be the highest address that is closest to origin whereas after several repeated searches the data will be represented on the bus in a sequence from lowest to highest.

What is claimed is:

1. A memory system comprising: a) an array of memory cells, each memory cell having a Bit Mask circuit, b) a bus circuit with a set of Address Bus lines, a set of Data Bus lines, a set of Origin Bus lines a set of Control lines, each memory cell being connected to each of said sets of lines, said Control lines comprising means to put the system in one of three operating modes as well as means to select one of a predefines set of relationships used for a search operation wherein:

in a first operating mode, the system stores data applied on said Data Bus lines in the memory cells having positions defined by data applied on said Address Bus lines, in a second operating mode, a memory cell having a position defined by the Address Bus lines outputs on the Data Bus lines data stored in that memory cell, and in a third operating mode, applying a searched data on the Address Bus lines and performing a search process wherein each memory cell with data matching the searched data outputs on the Data Bus lines a value representing the Address of the memory cell that matched the searched data, the memory cell verifies a previously selected relationship with address bytes applied on the Address Bus lines by the other memory cells having data that matches the searched data whereupon the bits of the memory cell are masked by said Bit Mask circuit such that the memory cell address is presented on the Data Bus lines only where the position of that particular memory cell is the closest, in a predefined direction, to the data set on the Origin Bus lines among all the memory cells with matching data.

2. A memory cell connected to a set of Address Bus lines, a set of Data Bus lines, a set of Origin Bus lines and a set of Control lines, the memory cell comprising a memory circuit with a comparator, an address content selector and a Bit Mask circuit wherein an operation mode of said memory cell is selected by a Control line such that the cell comparator may receive an address for comparing with an address of said memory cell in a first mode or a searched data for comparing with data stored in said memory cell in a second mode, and if the cell data are found matching in the second mode, said Bit Mask circuit logically combines the cell address with a predetermined origin address and with address bits of other matching memory cells such that the cell address with be output on the Data Bus only where it is the nearest to said origin address in a given direction.

3. A Bit Mask circuit, comprising a Range circuit and a Priority Mask circuit for enabling the retrieval of an address of a memory cell that is parallelly connected in an array of memory cells having a data Bus without scanning all the memory cells in the array of memory cells wherein the Range circuit masks the memory cell address in the event that it exceeds an Origin address in a predefined direction and prevents the memory cell address from being output on the Data Bus notwithstanding that the memory cell data is found to be matching a searched data, and the Priority Mask circuit logically combines the addresses of all the matching memory cells on the Data Bus such that the address of the memory cell is only output on the Data Bus if it is the closest to the origin address in the predefined direction.

4. A method for locating memory cells containing a searched data without scanning each of the memory cells in a memory by setting the searched data on an address bus, setting memory cell comparators to a data comparing mode, and setting an origin address for the searched data, said method comprising the following steps:

a) the memory cell comparators compare the searched data to the date stored in the memory cell, b) in the event that the memory cell data is found to be matching, a Range circuit masks the memory cell address if it does not fulfill the condition of being in a predefined relationship with the origin address, c) where the memory cell address fulfils the condition of being in a predefined relationship with the origin address, the memory cell address is output on a Data bus, d) a priority mask circuit receives as feedback the data resulting on the Data Bus from the outputs of a number of memory cells fulfilling said condition, and e) the memory cell address is logically combined in the priority mask circuit with the address bits of the other memory cells having matching data and fulfilling the same condition whereby only the address of the memory cell that is closest to the origin address is presented on the Data bus and all other addresses are masked by the priority mask circuit.

5. A method according to claim 4, wherein the predefined relationship is that the memory cell address be lower than the origin address in a predefined direction.

6. A method data according to claim 4, wherein the predefined relationship is that the memory cell address be lower than the origin address in a predefined direction or equal to the origin address.

7. A method according to claim 4, wherein steps a–d are repeated with the address of the last memory cell that has been presented on the Data Bus set as origin address until all the cells containing the requested data are found.

\* \* \* \* \*